United States Patent [19]
O'Connor

[11] Patent Number: 4,660,177
[45] Date of Patent: Apr. 21, 1987

[54] DUAL PORT COMPLEMENTARY MEMORY

[75] Inventor: Kevin J. O'Connor, Center Valley, Pa.

[73] Assignees: American Telephone and Telegraph Company; AT&T Bell Laboratories, both of Murray Hill, N.J.

[21] Appl. No.: 691,418

[22] Filed: Jan. 14, 1985

[51] Int. Cl.[4] ............................................. G11C 13/00
[52] U.S. Cl. ................................... 365/189; 365/154; 365/203
[58] Field of Search ............... 365/189, 154, 203, 230, 365/156, 181

[56] References Cited

U.S. PATENT DOCUMENTS 4,447,891  5/1984  Kadota .................................. 365/154
4,541,076  9/1985  Bowers et al. ........................ 365/190

OTHER PUBLICATIONS

"Dual-Port 8k RAM Allows 2-μP Memory Access", *EDN*, B. Travis, Aug. 1983, p. 100.
"Asynchronous Dual-Port RAM Simplifies Multiprocessor Systems", *EDN*, K. W. Pope, Sep. 1983, pp. 147-154.
"Smart Memories Seek Honors in Proliferating Small Systems", *Electronics*, R. Beresford, Jul. 1982, pp. 89-98.
"High-Density, Buried-Contact CMOS/SOS Static RAM's", *International Electron Devices Meeting*, A. G. F. Dingwall et al., 1978, pp. 193-196.
"16K CMOS/SOS Asynchronous Static RAM", *IEEE International Solid-State Circuits Conference*, A. G. F. Dingwall et al., Feb. 1979, pp. 104-105, 286.

*Primary Examiner*—Terrell W. Fears
*Attorney, Agent, or Firm*—James H. Fox

[57] ABSTRACT

A dual port memory is implemented in complementary (e.g., CMOS) technology so as to allow simultaneous uncontested read operations to the same memory cell. This is achieved by accessing one node of a bistable static cell through a n-channel and a p-channel access transistor. The opposite node is typically left unconnected to external access means. This technique also reduces the area required to implement the memory cell as compared to prior art NMOS techniques. If desired, an arbitration circuit can be included to arbitrate between simultaneous read/read or read/write operations on the same cell from the two ports.

12 Claims, 4 Drawing Figures

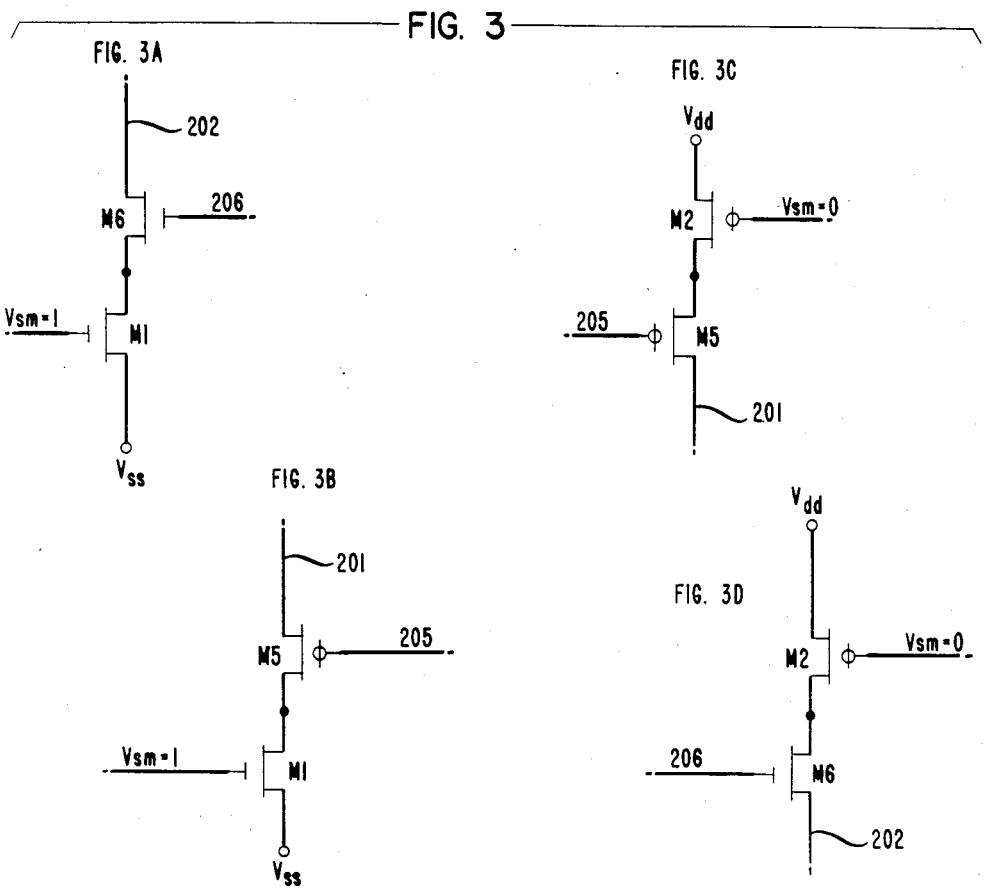
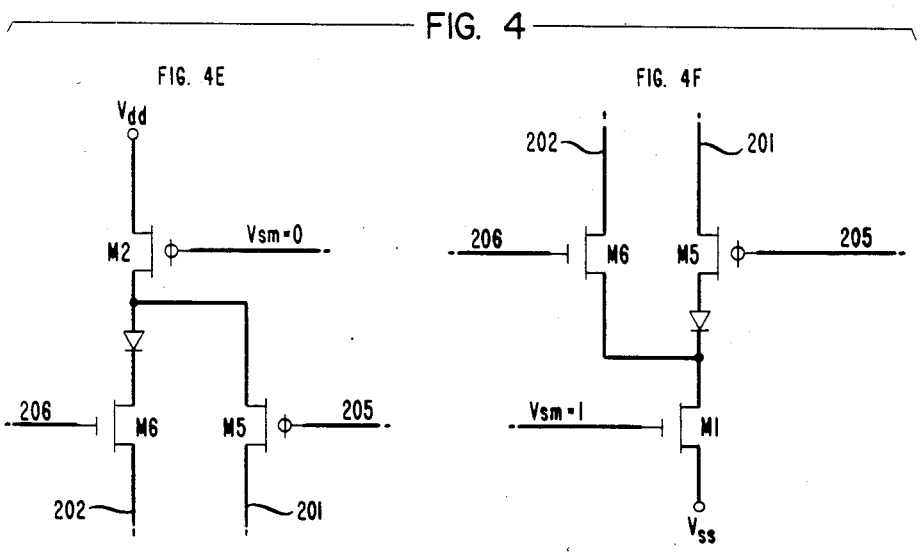

DUAL PORT COMPLEMENTARY MEMORY

BACKGROUND OF THE INVENTION

1. Field of the Invention

The present invention relates to a memory cell implemented in complementary (e.g., CMOS) technology which can be independently accessed from two ports.

2. Description of the Prior Art

Conventional memory systems store binary information in memory cells, and access the cells in a standard sequence. After the addresses of the desired cell is supplied to the memory subsystem, the requested data is returned. There is typically one information path for writing information into each cell and one path for reading information out. These are often multiplexed into a single bidirectional path, producing what may be referred to as a "single port" memory.

Conventional single port memories are asynchronous internally. That is, the times for accessing a multiplicity of cells do not necessarily occur at fixed intervals. However, the memories usually require a synchronous interface between themselves and the bus structure on which they communicate with a variety of other hardware units. This synchronizing usually occurs through time slot multiplexing on a shared address or data bus. The net result is an apparent reduction in bandwidth to any individual request for memory data in comparison to the asynchronous speed of any individual memory. Furthermore, there are applications in which synchronization cannot be maintained efficiently. For these, system designers have resorted to component level subsystems that allow multiple access paths to the storage array without the attendant timing problems. Such memories that allow independent access of memory cells over multiple paths are referred to as "multiport" memories. The most common type is the dual port memory. Though not exhaustive, the subsystems employing multiport memories include video screen buffers, common system data bases, arithmetic unit data buffers, address translators, and various forms of caches.

Several manufacturers are now introducing monolithic memory devices specifically tailored to multiport requirements. These devices provide various schemes for resolving "contentions" that arise when two ports seek to access the same memory cell. One such dual port device uses independent channel demultiplexers and address decoders. Semaphore registers are provided to allow users to coordinate access to shared memory resources by handing messages back and forth.

First-in-first-out, FIFO, register files are another form of commercially available multi-port devices. One such dual port CMOS memory, adds a second n-channel access transistor pair in parallel with the conventional set of access devices. Both access paths can reach cells for reading and writing, so long as contention conditions are properly handled; see FIG. 1.

The third area of commercial monolithic multiport activity is with dynamic memory configured to have a parallel and serial access path. Based on a conventional NMOS dynamic random access memory (DRAM), they contain several internal shift registers to allow data access by random address or serial time slot. The memory can be read or written as a conventional DRAM by providing row and column addresses in the conventional multiplexed mode. With proper timing, the internal array row structure can be read to, or written from, shift registers that can then be clocked in or out at a much higher rate than conventional DRAM multiplexed address access methods allow.

SUMMARY OF THE INVENTION

I have invented a memory cell comprising a bistable storage element having two nodes of opposite voltage levels. One of the nodes, designated the "access node", has connected thereto a first access transistor of a given conductivity type that couples the node to a first access port. A second access transistor of an opposite conductivity type is also connected to the access node, and couples it to a second access port. The first access transistor operates with one logic type (e.g., positive logic), whereas the second access transistor operates with the opposite logic type (e.g., negative logic). In this manner, all read contentions, even to the same cell, are avoided. The bistable storage element typically comprises two cross-coupled complementary inverter portions. The transistors are typically n-channel and p-channel field effect transistors, but bipolar types are also possible.

BRIEF DESCRIPTION OF THE DRAWINGS

FIGS. 3 and 4 show various cases of the appropriate active transistors during write operations.

DETAILED DESCRIPTION

Figure 2:
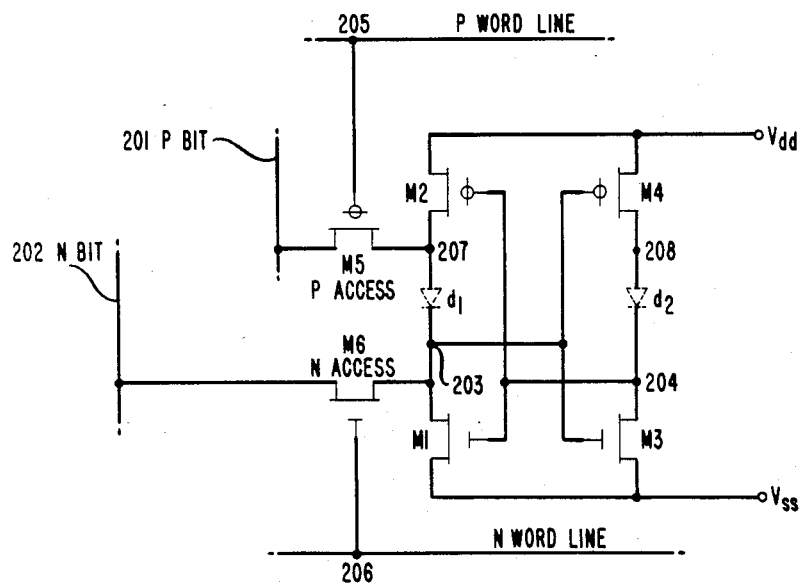
FIG. 2 shows the inventive dual port memory implemented in complementary (e.g., CMOS) technology.

The following detailed description relates to a complementary (e.g., CMOS) dual port memory cell. As used herein, the term "access port", or simply "port"; refers to a data path for transferring information into a memory cell ("write") or from a memory cell ("read"), or both. Referring to FIG. 2, a bistable circuit suitable for practicing the present invention typically includes two cross-coupled complementary inverters. Note firstly that information access to the bistable circuit is at one node (203) only, referred to as the "access node". This means that the other node (204) can be tailored as a true storage node, unaffected by read access requests to the access node. Also note that one access device (M5) is p-channel, while the other (M6) is n-channel. The access port that transfers data through the p-channel access transistor is referred to as the "p-port", and the one associated with the n-channel access transistor is the "n-port". Bit and word signals associated with the n-channel device are in the conventional positive logic form, but signals and data associated with the p-channel device are in negative logic, unless inverted by additional circuit means. It is possible through proper design trade-offs to read and write the cell independently from each port. In some applications this is not necessary, as when the associated circuitry generates a single result for storage each cycle, thus requiring only one write port, and a single write per cycle.

Figure 1:
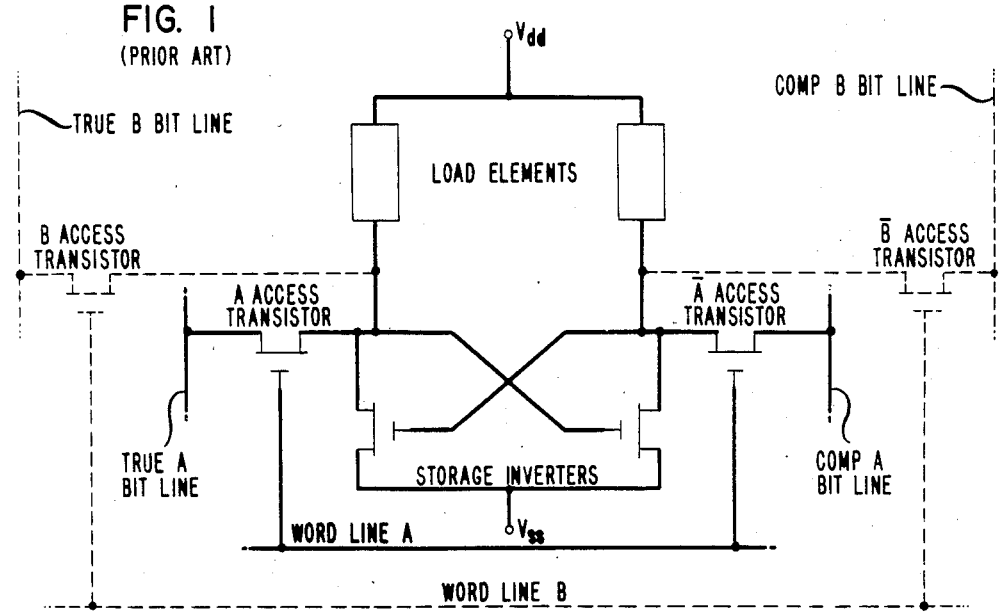
FIG. 1 shows a prior art dual port memory cell implemented in NMOS technology.

The present invention can be implemented in any complementary transistor technology, including field effect and bipolar technology. It is illustratively described in complementary metal oxide semiconductor (CMOS) technology herein. However, other types of insulated gate field effect transistors are also possible, as well as junction types. A typical CMOS process provides for one or more p-wells, or tubs in a semiconductor substrate, for the NMOS devices, and one or more n-wells for the PMOS devices. The PMOS access transistor M5 is readily inserted in the PMOS well associated with the PMOS load devices M2, M4. The additional word line (205) for the PMOS access transistor is strung between p-wells of adjacent cells along the row direction. Spaces remaining where the second conventional NMOS access device was removed (see FIG. 1) may be used for power or tub connections. The circuit may be implemented in a full CMOS, double level polysilicon implementation, but other forms are possible. Because parasitic diodes may be created under some processing conditions, two possible forms of the cell need to be analyzed, and they are both represented in FIG. 2. The schematic shows the difference by the inclusion of diodes (d1, d2) in the drain leads of the PMOS load transistors, shown in phantom diagram form. These diodes may appear through processing limitations of double level polysilicon interconnections that cause complementary doping of the interconnect polysilicon to the PMOS loads. The polysilicon is normally n type, but becomes p type between the tube boundary and the PMOS drains, from either p drain auto-doping or intentional overall n tub polysilicon conversion to p type. Other layout techniques may choose to sacrifice density and remove the diodes, as by using metal interconnections. In that case, nodes 203 and 207 are directly connected together, and nodes 204 and 208 are directly connected together.

Precharged bit lines (201, 202) are used to establish known and proper states on the bit lines before a read cycle is started. In conventional cell arrays with true and complement bit lines, measures are taken to insure that the bit line pairs are properly precharged and equilibrated. Shorting devices are often used to obtain equalization before full precharge is completed. At this design uses a single bit line per port, and uses positive and negative logic, complementary precharging establishes proper voltages for the bit lines. That is, the p bit line (201) is precharged low ($V_{ss}$), and the n bit line (202) is precharged high ($V_{dd}$). Note that the access ports can be made to have the same logic types (both positive or both negative) by the insertion of one (or an odd number) of inverters between a port and the memory cell. For example, a single bi-directional inverter between the p-channel access transistor and it associated port produces positive logic levels at that port.

Read operations involve independent actions by the p- and n-channel access transistors, and have a unique effect on the cell readout node. Table (1) lists the relationship between read and write states on the bit lines and word lines to the action taken by the access devices. As used herein, the term "state" refers to the voltage at the specified location as measured with respect to $V_{ss}$. As "1" state implies a high (positive) voltage, and a "0" state implies a low voltage, typically about zero volts. Note that the logic states may be the same, or opposite to the voltage states depending on whether positive or negative logic is being used, respectively.

TABLE 1

| Read and Write Conditions on Dual Port Cell | | |
|---|---|---|
| Readout Node State (positive logic) | p Access Transistor | n Access Transistor |
| | Read Operations | |
| 1 | active | passive |
| 0 | passive | active |
| | Write Operations | |

TABLE 1-continued

| Read and Write Conditions on Dual Port Cell | | |
|---|---|---|
| Readout Node State (positive logic) | p Access Transistor | n Access Transistor |
| 1 | inverter | source follower |
| 0 | source follower | inverter |

During a read out operation only one of the two access transistors performs an active operation. If the p port is read (line 205 goes low), and the stored state is a one, device M5 will conduct, charging the p bit line (201) from the $V_{ss}$ precharged level to a more positive level. But if the stored state is zero, device M5 will not conduct, as the gate, drain and source are all at $V_{ss}$. If the n port is read (node 206 goes high), and the stored state is a zero, device M6 will conduct, charging the n bit line (202) from the $V_{dd}$ precharged level to a more negative level. But if the stored state is a one, device M6 will not conduct, as the gate, drain and source are all at $V_{dd}$. Hence, even if both the p- and n-channel access transistors are simultaneously accessed, only one of them will conduct during a read operation. The asynchronous, uncontested nature of this cell is now apparent. Because the stored cell state controls the passive/active nature of the access transistors, there can be no conflicts when the same address is requested by both ports.

However, write operations are not so simple to analyze. Without the internal diodes present, the ability to write both states in the cell from each port independently depends on the ability of the access transistors to write as a source follower for one logic value, and as a common source transistor for the other. There is a tradeoff in access device to inverter device ratios for best cell margin. If only one port is required for writing, cell marging can be optimized independent of write contention considerations.

If the diode (d1) is present, and it has good cutoff characteristics when reverse biased, the p-channel access device alone cannot adequately write a zero to the access node (203) because of the isolation effect of the diode. If the diode is made leaky (a desirable condition in any case), the p-channel access transistor can write as a source follower. There is no such restriction on the n-channel access transistor, because it is directly connected to the access node (203), which is at the cross coupling point to the storage inverter, and can directly manipulate the stored state.

In a cell without diodes d1, d2, it is possible to choose a set of conditions that will allow write operations to occur from either port. There are still some constraints to observe, such as asynchronously writing the same cell from both ports, or reading and writing at the same cell. These can be controlled through access protocol or arbitration to obtain an acceptable interface.

During a write operation, there are four possible configurations for the two access transistors and the two complementary inverter transistors, M1, M2 since each port must be capable of writing either logic state into the cell. These four conditions are shown in FIG. 3 as four schematics representing those cell transistors that are actively (i.e., by conducting current) involved in writing.

In case A and B the stored memory state $V_{sm}$ is a logic one, while $V_{sm}$ is a logic zero in case C and D. Writing is caused by pulling the access node of M1 or M2 to the opposite state through the appropriate access device for that port. This is done by setting the respective bit lines, 202 or 201, to the appropriate logic level, and enabling the port access transistor M6 or M5. As the bit lines must be set to both one and zero levels for writing, and the access transistors of a given conductivity type are typically in shared tubs, it is usually not practical to boost the bit lines to achieve the required drive, or transistor junctions will become forward biased. Substrate generators would be required for both p and n type regions, and layout requirements would pose difficult design constraints. Therefore, it is assumed that a zero on a bit line is at $V_{ss}$, and a one is at $V_{dd}$, and boosting is limited to the gate electrodes of the access transistors. As used herein, "boosting" refers to producing a voltage in excess of the power supply voltages, that is, above $V_{dd}$ or below $V_{ss}$, and are measured herein with respect to $V_{ss}$.

In case A of FIG. 3 the stored one is written to a zero by the source follower action of the NMOS access device M6, and must have enough gate drive to pull the common node 203 through the transfer point of the feedback inverter M3-M4 (see FIG. 2). In Case B the PMOS access transistor must pull the same common node (203) through the transfer point, but as a common source connected transistor. The function of the n and p access transistors are reversed in case C and D, where the stored logic state is a zero, and the access devices pull the common node (203) toward $V_{ss}$.

To satisfy the independent writing at each port, it becomes necessary to boost the word line transfer gates above $V_{dd}$ and below $V_{ss}$ for the NMOS and PMOS transistors, respectively. By making simplifying assumptions about the operating conditions of the transistors, the required gate boost can be determined. In case A and C, where source follower action is used, the necessary assumption is the the access devices operate in the triode mode. This is reasonable as long as the access device gate voltage is boosted to at least $V_{DS}+V_{TH}$, where $V_{DS}$ is the drain-source voltage across the access transistor, and $V_{TH}$ is the threshold voltage thereof. The required gate drive may then be calculated by equating terminal currents and solving for $V_{w1}$, the word line voltage at the access transistor gate electrode (i.e., at node 205 or node 206). When the gate drive does not satisfy the previous triode region assumption, the access device can be treated as saturation. Suitable equations expressing the transfer characteristics of PMOS and NMOS transistors in the triode and saturation regions are well known in the art; see, for example, A. S. Grove, "Physics and Technology of Semiconductor Devices", John Wiley and Sons, Inc., New York (1967).

In Cases B and D, the access device operates in the common source mode, and the required gate boost can again be determined by making assumptions about the operating conditions of the two transistors. The active storage device (M2) is again in the triode region, but the transfer transistor remains in the saturation region until the storage node moves a $V_{TH}$ away from the stored value. The device then enters the triode region for the remainder of the write operation. To simplify the calculations, it may be assumed that the access devices are always in the triode region.

Consider the required gate boost voltage for Case A where an NMOS access device must pull the drain of a common source NMOS transistor from $V_{22}$ to the transfer point $V_{tr}$ of the inverter M3-M4 to write into the memory cell. Depending on device sizes, threshold voltages, etc., some amount of boost above $V_{dd}$ may be required to reach $V_{tr}$. For typical values of $2 v \leq V_{tr} \leq 3$ v, $V_{TH}=0.75$ v, $V_{dd}=5$ v, and load-to-access device size ratios of about 2:1, the necessary boost as a function of the transfer voltage $V_{tr}$, and load to access device $\beta$ ratio has been calculated for each of the four cases A, B, C, and D. These calculations show, for example, that for Case A, the gate should be boosted in the range from 6 to 17 volts. For Case B, the boost is $-1.5$ to $-13$ volts; for Case C, 0.5 to $-3.1$ volts, and for Case D, 0.5 to 5.8 volts. Note the the boost voltages are with respect to the negative power supply voltage, $V_{ss}$.

Single Write Port, Dual Read Port: If diodes are present in the PMOS inverter transistors, the p-channel transistor alone cannot write a zero state at the access node since that would require conducting current through the reverse-biased diode ($d_1$) to discharge access node 203. Therefore the n-channel device is used to write the zero. However, it may be assisted by the p-channel access transistor (M5), which may be turned on to discharge node 207 to a low voltage level during the writing of a zero. This assist reduces the current that the n-channel access transistor (M6) otherwise has to conduct in writing a zero when a one state was previously stored at node 203. Since the PMOS port can write only the ones states when $d_1$ is present, there is then only one full write port, the one coupled to the n-channel access transistor. (However, it may be assisted in writing a one by also activating the p-channel access transistor, and also assisted in writing a zero as noted above.) This single write port can be shared by devices requesting write access to the array, which can be selected by arbitration. In this single write-port configuration, device ratios can be optimized to provide adequate write levels without the boosting of n or p channel word lines (206 and 205, respectively). Further, the PMOS and NMOS access transistors are assumed to operate in saturation until switching of the cell occurs. This assumption is made because the feedback threshold, $V_{tr}$, will generally be reached before the gate voltage of the access devices, at 206 and 205, reach their final values of $V_{dd}$ and $V_{ss}$ respectively.

FIG. 4 shows the two circuits that are active for writing ones and zeros when both ports are combined for writing a cell; that is, when the p-channel access transistor (M5) assists the n-channel device (M6). Primary write currents in each case are supplied by the access transistor operating in the common source mode, with assistance from the device operating as a source follower. In Case E the cell is storing a zero ($V_{sm}=0$). A logic one (zero at access node) is written by the combined effort of the p and n channel access transistors. The PMOS word line 205 is assumed at $V_{ss}$, and the NMOS word line 206 drive may be calculated. If a diode is present, and as long as it remains forward biased, the PMOS device can assist in writing the zero level. If no diode is present both M5 and M6 assist until writing is accomplished.

Case F shows a cell with a stored on ($V_{sm}=1$) being written to a zero. Again both the n and p ports provide current to write a zero (one at access node). The NMOS word line 206 is assumed at $V_{dd}$, and the PMOS word line 205 drive may be calculated.

The required gate voltage on 206 has been calculated for Case E, where a NMOS access device pulls the drain of a common source PMOS transistor from $V_{dd}$ to the transfer point $V_{tr}$. The gate voltage has also been calculated for the other port, at 205 and Case F, where a PMOS access device pulls the drain of a common source NMOS transistor from $V_{ss}$ to the transfer point $V_{tr}$. For typical values of $2 v \leq V_{tr} \leq 3 v$, $V_{TH}=0.75 v$, $V_{dd}=5 v$, and load to access device size ratios of about 2:1, the calculations show the necessary word line (206) voltage range from 1.2 to 3.3 volts for Case E, and for word line 205 2.0 to $-2.9$ volts for Case F. For a wide range of parameters, writing can be done without boosting the NMOS gate above $V_{dd}$ or the PMOS gate below $V_{ss}$.

If the n and p bit line ports are to be independent, some method should be established to separate the reading and writing of ones on the n port, and the reading and writing of zeros on the p port. That is, the bit line precharge voltages during read operations should not interfere with the data stored in the memory cell. This requirement exists because there is a point at which, for any given gate voltage, read precharge levels become adequate to write and data integrity in the cell is lost. Several methods can be used to differentiate read/write conditions, ranging from controlling capacitance ratios, as in dynamic memories, to controlling bit line voltages and impedances. One read mode technique precharges the bit lines to $\frac{2}{3} V_{dd}$ for the n port, and $\frac{1}{3} V_{dd}$ for the p port. With read levels lower than write levels, read/write operations are isolated. The sense amplifiers for the n port and p port are set near $\frac{1}{3} V_{dd}$ and $\frac{2}{3} V_{dd}$ for the n port and p port respectively. The previous conditions for active and passive readout behavior are maintained, and active readout causes bit lines to cross the sense amplifier threshold.

With the diodes present, readout can proceed in a manner similar to the case when they are missing. The access devices are attached directly to their respective inverter transistors, PMOS to PMOS, NMOS to NMOS. The diode adds additional isolation by being reverse biased for stored ones read from the NMOS port, and isolates the stored zero from the PMOS port by the offset forward voltage of the diode.

The foregoing has illustrated the present technique with a four-transistor dual complementary inverter memory cell. However, other bistable circuits are possible. For example, non-complementary cross-coupled bistable circuits using 4 NMOS transistors are known in the art, with others being possible. Also, as noted above, bipolar transistors can be used for both the access devices and the bistable storage circuit. Then, both a pnp and npn transistor have a controlled electrode (e.g., their emitters) connected to the storage node. The bases of the access transistors may be connected to the word lines, and the other controlled electrode (e.g., their collectors) connected to the bit lines associated with the two access ports. Then, uncontested read operations are possible from the cell, as before. Note that bipolar transistors are typically undirectional devices. Hence, writing a one may be more easily accomplished from one port, and writing a zero from the other port. Arbitration to select the proper port may then be provided for a write operation. Alternately, it is known to make bidirectional bipolar devices by the proper choice of emitter and collector geometries and doping levels. In that case, writing can be accomplished from either port, with assistance of the other port if desired.

What is claimed is:

1. An integrated circuit comprising at least one information memory cell adapted to being accessed from a first port and a second port,
and wherein said cell comprises a bistable circuit having a first node and a second node that are stable in opposite voltage levels, and switchable between said levels in response to an information signal,
characterized in that
said first node is coupled to said first port through an access transistor of a first conductivity type when the votage on the control electrode thereof is at low level, and said first node is coupled to said second port through an access transistor of a second conductivity type when the voltage on the control electrode thereof is at a high level.

2. The integrated circuit of claim 1 wherein said bistable circuit comprises a first complementary inverter that is cross-coupled with a second complementary inverter.

3. The integrated circuit of claim 1 further comprising
arbitration means for determining which of said first and second ports accesses said cell prior to the other during a write operation from either of said ports.

4. The integrated circuit of claim 1 wherein said ports are adapted to communicate binary information between said cell and a source of information that is external to said integrated circuit.

5. The integrated circuit of claim 1 further comprising computation means for performing logical operations on binary data, wherein said ports are adapted to communicate binary information between said cell and said computation means.

6. The integrated circuit of claim 1 further comprising an inverter coupled between one of said ports and the access transistor coupled thereto, whereby the logic level at said port is inverted with respect to said first node.

7. The integrated circuit of claim 1 wherein said access transistor of a first conductivity type is a p-channel field effect transistor, and said access transistor of a second conductivity type is a n-channel field effect transistor, and wherein said control electrode is the gate thereof.

8. The integrated circuit of claim 7 wherein at least during a portion of a write operation into said cell the voltage on the gate of said p-channel field effect transistor is boosted more negative then the negative power supply voltage applied to said bistable circuit.

9. The integrated circuit of claim 7 wherein at least during a portion of a write operation into said cell the voltage on the gate of said n-channel field effect transistor is boosted more positive than the positive power supply voltage applied to said bistable circuit.

10. The integrated circuit of claim 7 wherein a write operation may be performed into said memory cell from either of said first and second ports.

11. The integrated circuit of claim 7 wherein a write operation may be performed into said memory cell only from said second port due to the presence of a diode between said first port and said first node.

12. The integrated circuit of claim 1 wherein said access transistor of a first conductivity type is a pnp bipolar transistor, and said access transistor of a second conductivity type is a npn bipolar transistor.

* * * * *